(12) United States Patent
Zhang et al.

(10) Patent No.: US 11,177,297 B2
(45) Date of Patent: Nov. 16, 2021

(54) ARRAY SUBSTRATE AND MANUFACTURING METHOD THEREFOR, AND DISPLAY DEVICE

(71) Applicant: BOE TECHNOLOGY GROUP CO., LTD., Beijing (CN)

(72) Inventors: Bin Zhang, Beijing (CN); Yu Cheng Chan, Beijing (CN); Tingting Zhou, Beijing (CN); Xiaolong He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 500 days.

(21) Appl. No.: 16/316,174

(22) PCT Filed: May 14, 2018

(86) PCT No.: PCT/CN2018/086709
§ 371 (c)(1),
(2) Date: Jan. 8, 2019

(87) PCT Pub. No.: WO2018/228108
PCT Pub. Date: Dec. 20, 2018

(65) Prior Publication Data
US 2021/0288082 A1  Sep. 16, 2021

(30) Foreign Application Priority Data
Jun. 16, 2017 (CN) .......................... 201710457121.2

(51) Int. Cl.
*H01L 27/12* (2006.01)
*H01L 29/786* (2006.01)

(52) U.S. Cl.
CPC ........ *H01L 27/1251* (2013.01); *H01L 27/127* (2013.01); *H01L 27/1222* (2013.01); *H01L 29/78633* (2013.01)

(58) Field of Classification Search
CPC ............... H01L 27/1251; H01L 27/127; H01L 27/1222; H01L 27/3272; H01L 29/78633; G02F 1/136209; G02F 1/133512
See application file for complete search history.

(56) References Cited

U.S. PATENT DOCUMENTS 8,218,120 B2   7/2012  Ahn et al.
2012/0205658 A1  8/2012  Lee
(Continued)

FOREIGN PATENT DOCUMENTS

CN    102637717 A    8/2012
CN    103579356 A    2/2014
(Continued)

OTHER PUBLICATIONS

International Search Report and Written Opinion dated Aug. 21, 2018.

*Primary Examiner* — Mohammed R Alam
(74) *Attorney, Agent, or Firm* — Dilworth & Barrese, LLP.; Michael J. Musella, Esq.

(57) ABSTRACT

An array substrate, a manufacturing method thereof, and a display device are provided. The array substrate includes a base substrate and a thin film transistor on the base substrate; a light shielding layer is disposed between the thin film transistor and the base substrate, and the light shielding layer includes a light shielding metal layer and a light reflection adjusting layer which are stacked on the base substrate, the light reflection adjusting layer covers the light shielding metal layer, and a reflectance of the light reflection adjusting layer is lower than a reflectance of the light shielding metal layer.

10 Claims, 2 Drawing Sheets

(56) References Cited

U.S. PATENT DOCUMENTS

2012/0205659 A1* 8/2012 Lee ..................... H01L 27/1218
257/72
2014/0293182 A1* 10/2014 Kim .................. G02F 1/133512
349/43

FOREIGN PATENT DOCUMENTS

| CN | 104102052 A | 10/2014 |
| CN | 106019695 A | 10/2016 |
| CN | 107093611 A | 8/2017 |

* cited by examiner

ARRAY SUBSTRATE AND MANUFACTURING METHOD THEREFOR, AND DISPLAY DEVICE

The present application claims priority of China Patent application No. 201710457121.2 filed on Jun. 16, 2017, the content of which is incorporated in its entirety as portion of the present application by reference herein.

TECHNICAL FIELD

Embodiments of the present disclosure relate to an array substrate, a manufacturing method thereof, and a display device.

BACKGROUND

Thin film transistor (TFT) plays a significant role as a switching element in the field of display technology. A conventional thin film transistor includes a gate electrode, a source electrode, a drain electrode, an active layer, and the like, and the thin film transistor is divided into thin film transistor with a top gate structure and thin film transistor with a bottom gate structure, according to a relative positional relationship between the gate electrode and the active layer.

SUMMARY

At least one embodiment of the present disclosure provides an array substrate, including a base substrate and a thin film transistor on the base substrate; a light shielding layer is disposed between the thin film transistor and the base substrate, and the light shielding layer includes a light shielding metal layer and a light reflection adjusting layer which are stacked on the base substrate, the light reflection adjusting layer covers the light shielding metal layer, and a reflectance of the light reflection adjusting layer is lower than a reflectance of the light shielding metal layer.

Another embodiment of the present disclosure provides a manufacturing method of an array substrate. The manufacturing method of the array substrate includes: providing a base substrate, forming a light shielding metal layer on the base substrate; forming a light reflection adjusting layer on the light shielding metal layer such that the light reflection adjusting layer covers the light shielding metal layer, and a reflectance of the light reflection adjusting layer being lower than a reflectance of the light shielding metal layer, the light reflection adjusting layer and the light shielding metal layer together constituting a light shielding layer; and forming a thin film transistor on the light reflection adjusting layer, to obtain the array substrate.

Yet another embodiment of the present disclosure provides a display device, the display device includes the array substrate provided by the abovementioned embodiments.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "include," "including," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Upon a thin film transistor with a top gate structure being disposed in an array substrate, an active layer of the thin film transistor is located between a gate electrode of the thin film transistor and a base substrate of the array substrate, and a light shielding layer is usually disposed between the active layer and the base substrate. The light shielding layer is used to block light incident from the base substrate to the active laver, so as to prevent the active layer from being irradiated by the light incident from the base substrate, thereby affecting the conductive property of the active layer.

However, because the light shielding layer is generally formed of a metal material such as molybdenum (Mo) metal, it has a high light reflectivity. Therefore, if external light or reflected light of other functional films irradiates a surface of the light shielding layer facing the active layer, the light shielding layer may reflect the irradiating light into a conductive channel of the active laver, so that leakage current may be generated in the conductive channel of the active layer, which may shift a threshold voltage of the thin film transistor and may result in unstable usage of the array substrate where the thin film transistor is located.

Figure 1:
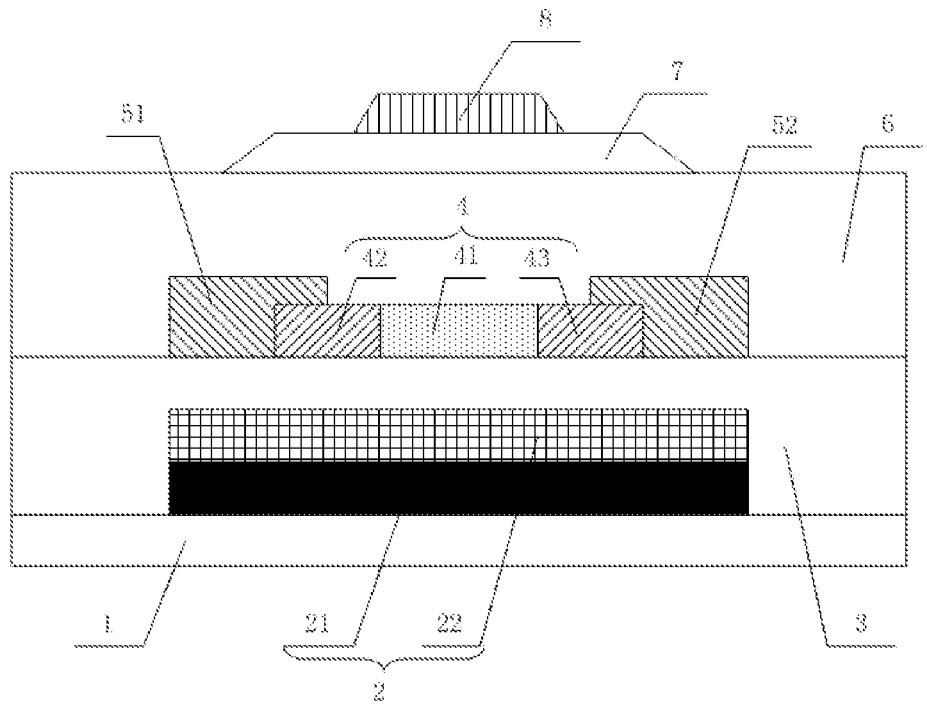
FIG. 1 is a schematic structural diagram of an array substrate provided by an embodiment of the present disclosure.

Referring to FIG. 1, an array substrate provided by an embodiment of the present disclosure includes a base substrate 1 and a thin film transistor disposed on the base substrate 1; a light shielding layer 2 is disposed between the thin film transistor and the substrate 1, and the light shielding layer 2 includes a light shielding metal layer 21 and a light reflection adjusting layer 22 which are stacked on the base substrate 1. The light reflection adjusting layer 22 covers the light shielding metal layer 21, and a reflectance of the light reflection adjusting layer 22 is lower than that of the light shielding metal layer 21.

In the array substrate provided by the embodiment of the present disclosure, the light shielding metal layer 21 is formed on the base substrate 1, and the light reflection adjusting layer 22 is formed on a surface of the light shielding metal layer 21 away from the base substrate 1, so that the light reflection adjusting layer 22 covers the light shielding metal layer. 21, and the light shielding metal layer 21 and the light reflection adjusting layer 22 together constitute the light shielding layer 2; then, a thin film transistor is formed on a side of the light reflection adjusting layer 22 away from the base substrate 1; that is, the thin film transistor is formed on a side of the light shielding layer 2 away from the base substrate 1. In this way, the light shielding layer 2 is located between the base substrate 1 and the thin film transistor, the light reflection adjusting layer 22 of the light shielding layer 2 covers the light shielding metal layer 21. If external light or light reflected by other functional films irradiates on a surface of the light shielding layer 2 facing the thin film transistor, the light irradiates a surface of the light reflection adjusting layer 22 facing the thin film transistor. Because the reflectance of the light reflection adjusting layer 22 is lower than the reflectance of the light shielding metal layer 21, compared with a case that light is irradiated on a surface of the light shielding metal layer facing the thin film transistor in the existing art, upon light being irradiated on the surface of the light reflection adjusting layer 22 facing the thin film transistor, light is less easier to be reflected to the thin film transistor and influence a conductive channel 41 of an active layer 4 of the thin film transistor.

The array substrate provided by the embodiment of the present disclosure utilizes the light reflection adjusting layer 22 and the light shielding metal layer 21 to together constitute the light shielding layer 2, which can properly reduce the light intensity of light reflected by the light shielding layer 2 to the thin film transistor, so as to reduce irradiating influence of the light reflected by the light shielding layer 2 on the conductive channel 41 of the active layer 4 of the thin film transistor, preventing the conductive channel 41 of the active layer 4 from generating leakage current due to irradiation of the light reflected by the light shielding layer 2, preventing a threshold voltage of the thin film transistor from shifting, and avoiding unstable usage of the array substrate where the thin film transistor is located. Therefore, the array substrate provided by the embodiment of the present disclosure can improve the usage stability of the array substrate.

It is worth mentioning that the light shielding layer 2 is constituted by both the light shielding metal layer 21 and the light reflection adjusting layer 22, wherein the light shielding metal layer 21 is formed of a light shielding metal such as molybdenum (Mo) or an alloy thereof; and the light reflection adjusting layer 22 can be formed of a light transmitting material or a light shielding material. A thickness of the light reflection adjusting layer 22 is not specifically limited herein, and can be determined by one skilled in the art according to actual conditions, as long as the light reflection adjusting layer 22 is made of a material having a reflectance lower than that of the material of light shielding metal layer 21. Besides, the lower the reflectance of the light reflection adjusting layer 22, the better.

For example, the light reflection adjusting layer 22 is an amorphous silicon film; the amorphous silicon film is easily formed on the light shielding metal layer 21, and reflectance of the amorphous silicon film to visible light is low, generally less than 3%. By using the amorphous silicon film as the light reflection adjusting layer 22, the reflectance of the light reflection adjusting layer 22 to visible light can be effectively reduced, so that visible light incident on the light reflection adjusting layer 22 is hardly reflected to the thin film transistor, thereby ensuring that the array substrate where the thin film transistor is located can be used stably.

Figure 3:
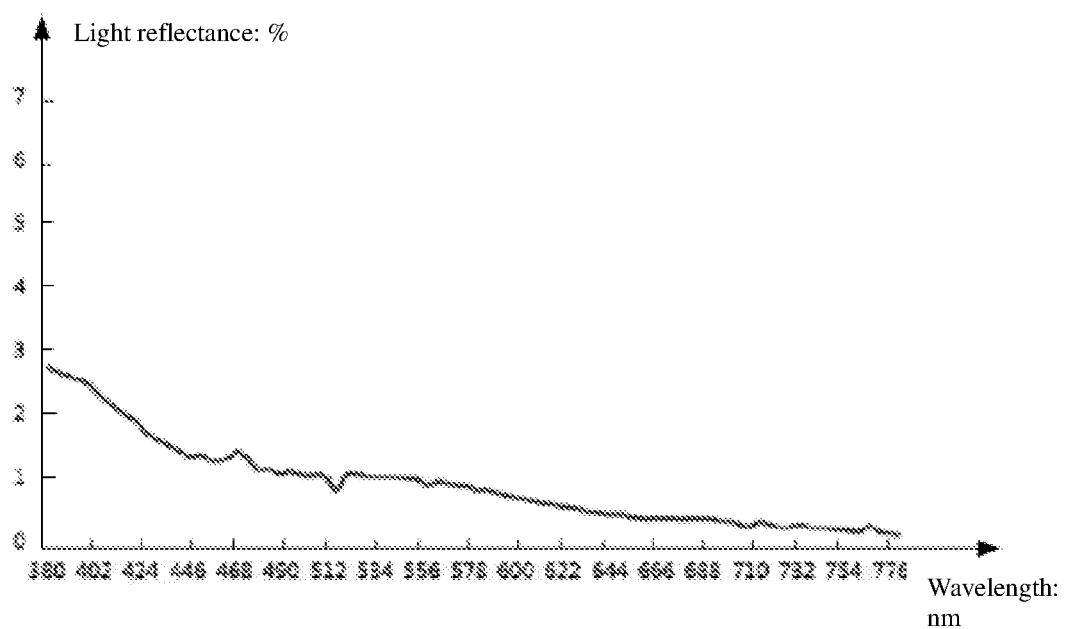
FIG. 3 is a graph of a reflectance of an amorphous silicon film provided by an embodiment of the present disclosure.

FIG. 3 is a graph of a reflectance of an amorphous silicon film serving as the light reflection adjusting layer 22 to the visible according to an embodiment of the present disclosure. Referring to FIG. 3, it can be seen that wavelength of visible light is usually between 380 nm and 776 nm. Upon an amorphous silicon film is used as the light reflection adjusting layer 22, the reflectance of the light reflection adjusting layer 22 to visible light gradually reduces with the increasing wavelength of visible light, and the light reflection adjusting layer 22 has a maximum reflectance to visible light of less than 3%. Therefore, by using the amorphous silicon film as the light reflection adjusting layer 22, it is possible to effectively prevent light incident on the light reflection adjusting layer 22 from being reflected to the thin film transistor.

It should be noted that, in the array substrate provided by abovementioned embodiment, the light shielding layer 2 is disposed between the base substrate 1 and the thin film transistor to block light from arriving at the active layer of the thin film transistor from a side where the base substrate 1 is located. In this way, the array substrate is applied to an array substrate employing a thin film transistor with a top gate structure, that is, in the array substrate provided by the embodiment of the present disclosure, the thin film transistor is a thin film transistor with a top gate structure.

For example, referring to FIG. 1, the thin film transistor with a top gate structure in the present embodiment includes an active layer 4, a source electrode 51, a drain electrode 52, a gate electrode 8, and the like, wherein:

The active layer 4 is formed on a side of the light reflection adjusting layer 22 away from the base substrate 1, and an interlayer insulating layer 3 is disposed between the active layer 4 and the light reflection adjusting layer 22; an orthographic projection of the active layer 4 is on the base substrate 1 is covered by an orthographic projection of the light shielding metal layer 21 on the base substrate 1. Thus, by using the light shielding metal layer 21, it is possible to ensure that light incident on the active layer 4 of the thin film transistor from a side where the base substrate 1 is located can be effectively shielded, thereby preventing conductive properties of the active layer 4 from being influenced by illumination.

The source electrode 51 and the drain electrode 52 are respectively disposed on the active layer 4 in a same layer; the source electrode 51 is connected with a first doped region 42 of the active layer 4, and the drain electrode 52 is connected with a second doped region 43 of the active layer; a conductive channel 41 of the active layer 4 is formed between the first doped region 42 and the second doped region 43.

A passivation layer 6 is disposed on the active layer 4, the source electrode 51 and the drain electrode 52, respectively; a gate insulating layer 7 and a gate electrode 8 are stacked on the passivation layer 6; the gate electrode 8 is usually formed of a metal and has light shielding performance. In a case where an orthographic projection of the gate electrode 8 on the base substrate 1 covers an orthographic projection of the active layer 4 on the base substrate 1, particularly covers an orthographic projection of the conductive channel 41 of the active layer 4 on the base substrate 1, by using the gate electrode 8, external light can be effectively blocked from entering the conductive channel 41 of the active layer 4 from a side of the gate electrode 8 away from the base substrate 1, thereby avoiding the conductive property of the conductive channel 41 of the active layer 4 being affected by illumination, so as to ensure stable usage of thin film transistor.

Figure 2:
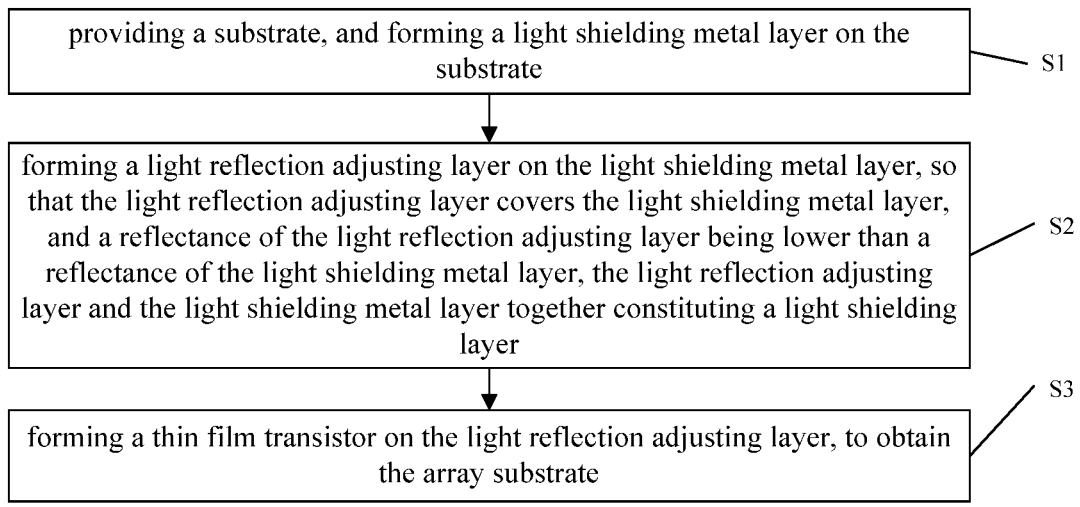
FIG. 2 is a flow chart of a manufacturing method of an array substrate provided by an embodiment of the present disclosure.

At least one embodiment of the present disclosure further provides a manufacturing method of an array substrate, for manufacturing the array substrate provided in the abovementioned embodiments. Referring to FIG. 2, the manufacturing method of an array substrate includes the following steps:

Step S1: providing a substrate, and forming a light shielding metal layer on the substrate;

Step S2: forming a light reflection adjusting layer on the light shielding metal layer, so that the light reflection adjusting layer covers the light shielding metal layer, and a reflectance of the light reflection adjusting layer being lower than a reflectance of the light shielding metal layer, the light reflection adjusting layer and the light shielding metal layer together constituting a light shielding layer;

Step S3: forming a thin film transistor on the light reflection adjusting layer, to obtain an array substrate.

The favorable effects which can be achieved by the manufacturing method of an array substrate provided by the embodiments of the present disclosure are the same as those of the array substrate provided by the abovementioned embodiments, and the repeated portions are omitted herein.

It can be understood that the light shielding layer is formed by both the light shielding metal layer and the light reflection adjusting layer, wherein the light shielding metal layer can be formed of a metal having light shielding performance, such as molybdenum (Mo) metal or an alloy thereof, and the light reflection adjusting layer needs to be formed of a material having a reflectance lower than that of the material of light shielding metal layer. For example, the light reflection adjusting layer is formed of an amorphous silicon material, and the amorphous silicon material has a low reflectance to visible light; the light reflection adjusting layer formed of the amorphous silicon material can effectively reduce the reflectance of the light reflection adjusting layer to visible light. In this way, the visible light incident on the light reflection adjusting layer is hardly reflected to the thin film transistor, thereby ensuring that the array substrate where the thin film transistor is located can be stably used.

In order to simplify the manufacturing method of an array substrate to improve manufacturing efficiency of the array substrate, in the manufacturing method of an array substrate provided by the abovementioned embodiments, the light shielding metal layer and the light reflection adjusting layer are formed by one single patterning process.

For example, a light shielding metal layer is deposited on a base substrate, a light reflection adjusting layer is deposited on the light shielding metal layer, and then one optical mask process is used to pattern the light shielding metal layer and the light reflection adjusting layer, to obtain a light shielding layer.

In the abovementioned embodiments, the deposition of the light shielding metal layer and the deposition of the light reflection adjusting layer may employ a chemical vapor deposition process or a physical vapor deposition process. Of course, the present disclosure is not limited thereto, and other processes which can be used for forming a film are applicable. The embodiments of the present disclosure are not limited thereto.

It should be noted that, in the array substrate provided by the abovementioned embodiments, in a case where the thin film transistor is a thin film transistor with a top gate structure, in the manufacturing method of an array substrate provided by the present embodiment, S3: forming a thin film transistor on the light reflection adjusting layer, includes:

Forming an interlayer insulating layer on the light reflection adjusting layer, forming an active layer on the interlayer insulating layer, such that an orthographic projection of the light shielding metal layer on the base substrate covers an orthographic projection of the active layer on the base substrate, so as to ensure that light incident on the active layer of the thin film transistor from a side where the base substrate is located can be effectively blocked by the light shielding layer, thereby preventing the conductive property of the conductive channel of the active layer from being affected by illumination;

Forming a source electrode and a drain electrode in the same layer on the active layer, respectively, such that the source electrode is connected with a first doped region of the active layer, the drain electrode is connected with a second doped region of the active layer, and the conductive channel of the active layer is formed between the first doped region and the second doped region; and Forming a passivation layer on the active layer, the source electrode and the drain electrode, respectively, forming a gate insulating layer and a gate electrode on the passivation layer, such that an orthographic projection of the gate electrode on the base substrate covers an orthographic projection of the active layer on the base substrate, particularly covers an orthographic projection of the conductive channel of the active layer on the base substrate. Thus, by using the gate electrode, external light can be effectively blocked from entering the conductive channel of the active layer from a side of the gate electrode away from the base substrate, thereby avoiding the conductive property of the conductive channel of the active layer from being affected by illumination, so as to ensure stable use of thin film transistor An embodiment of the present disclosure further provides a display device, which includes the array substrate provided by the abovementioned embodiments. The array substrate in the display device has the same advantages as the array substrate in the abovementioned embodiment, and the repeated portions are omitted herein.

The display device provided by the above embodiments may be a product or component having a display function, such as a mobile phone, a tablet computer, a television, a display, a notebook computer, a digital photo frame, or a navigator.

The foregoing is only a specific embodiment of the present disclosure, but the scope of protection of the present disclosure is not limited thereto, and the scope of protection of the present disclosure is subject to the scope of protection of the claims.

What is claimed is:

1. An array substrate, comprising a base substrate and a thin film transistor on the base substrate; wherein a light shielding layer is disposed between the thin film transistor and the base substrate, and the light shielding layer comprises a light shielding metal layer and a light reflection adjusting layer which are stacked on the base substrate, the light reflection adjusting layer covers the light shielding metal layer, and a reflectance of the light reflection adjusting layer is lower than a reflectance of the light shielding metal layer, wherein the light reflection adjusting layer is an amorphous silicon film.

2. The array substrate according to claim 1, wherein the thin film transistor is a thin film transistor with a top gate structure.

3. The array substrate according to claim 1, wherein an active layer of the thin film transistor is formed on a side of the light reflection adjusting layer away from the base substrate; and an orthographic projection of the light shielding metal layer on the base substrate covers an orthographic projection of the active layer on the base substrate.

4. The array substrate according to claim 3, wherein a gate electrode of the thin film transistor is formed on a side of the active layer away from the base substrate, and an orthographic projection of the gate electrode on the base substrate covers an orthographic projection on the active layer on the base substrate.

5. A manufacturing method of an array substrate, wherein the manufacturing method comprises: providing a base substrate, forming a light shielding metal layer on the base substrate; forming a light reflection adjusting layer on the light shielding metal layer such that the light reflection adjusting layer covers the light shielding metal layer, and a reflectance of the light reflection adjusting layer being lower than a reflectance of the light shielding metal layer, the light reflection adjusting layer and the light shielding metal layer together constituting a light shielding layer; and forming a thin film transistor on the light reflection adjusting layer, to obtain the array substrate, wherein the light reflection adjusting layer is formed of an amorphous silicon material.

6. The manufacturing method of an array substrate according to claim 5, wherein the light shielding metal layer and the light reflection adjusting layer are formed by one patterning process.

7. The manufacturing method of an array substrate according to claim 6, wherein the light shielding metal layer and the light reflection adjusting layer being formed by a single patterning process, comprising:
depositing the light shielding metal layer on the base substrate, depositing the light reflection adjusting layer on the light shielding metal layer, and patterning the light shielding metal layer and the light reflection adjusting layer by one mask process.

8. A display device, comprising the array substrate according to claim 1.

9. The array substrate according to claim 2, wherein an active layer of the thin film transistor is formed on a side of the light reflection adjusting layer away from the base substrate; and an orthographic projection of the light shielding metal layer on the base substrate covers an orthographic projection of the active layer on the base substrate.

10. The array substrate according to claim 9, wherein a gate electrode of the thin film transistor is formed on a side of the active layer away from the base substrate, and an orthographic projection of the gate electrode on the base substrate covers an orthographic projection on the active layer on the base substrate.

* * * * *